United States Patent [19]

Oda et al.

[11] Patent Number: 4,608,695

[45] Date of Patent: Aug. 26, 1986

[54] LASER DEVICE FORMED WITH A STRIPE LIGHT EMISSION REGION

[75] Inventors: Tatsuji Oda, Atsugi; Takayoshi Mamine, Kawasaki; Osamu Yoneyama, Hiratsuka, all of Japan

[73] Assignee: Sony Corporation, Tokyo, Japan

[21] Appl. No.: 535,788

[22] Filed: Sep. 26, 1983

[30] Foreign Application Priority Data

Sep. 30, 1982 [JP] Japan .................................. 57-172202

[51] Int. Cl.$^4$ .............................................. H01S 3/19
[52] U.S. Cl. ...................................... 372/45; 357/17; 372/46
[58] Field of Search ....................... 372/44, 45, 46, 48; 357/17

[56] References Cited

FOREIGN PATENT DOCUMENTS 0211791 12/1982 Japan .................................... 372/46

Primary Examiner—James W. Davie
Attorney, Agent, or Firm—Hill, Van Santen, Steadman & Simpson

[57] ABSTRACT

A semiconductor laser device having a stripe light emission region formed in an active layer, a bent portion formed in the active layer on a light end portion of the light emission region in a range of approximately the width of the light emission region, and a flat portion formed in the active layer the width of which is made larger than that of the light emission region inside of the end portion of the light emission region.

1 Claim, 6 Drawing Figures

LASER DEVICE FORMED WITH A STRIPE LIGHT EMISSION REGION

BACKGROUND OF THE INVENTION

1. Field of the Invention

The present invention relates generally to semiconductor laser devices and more particularly relates to a semiconductor laser device which is suitable for a recording or readout light source of a recording and/or reproducing apparatus for an optical video disc, a digital audio disc and so on.

2. Description of the Prior Art

Roughly classified, conventional semiconductor laser devices are of a refractive index-guiding type and a gain-guiding type regarding its optical and carrier confinement mechanisms.

Examples of the refractive index-guiding type semiconductor laser device are shown, for example, in FIGS. 1 and 2. As shown in FIGS. 1 and 2, a GaAs substrate 1 of, for example, N type is provided. On one major surface thereof is previously formed a stripe concave portion 2 (in FIG. 1) or convex portion 3 (in FIG. 2) which extends in the one direction. On the substrate 1 which includes the concave portion 2 or the convex portion 3 are sequentially epitaxially grown an N type first cladding layer 4 made of $Al_xGa_{1-x}As$, a P or N type active layer 5 made of, for example, GaAs, a P type second cladding layer 6 made of $Al_xGa_{1-x}As$ and a P type capping layer 7 which is useful for the ohmic contact with an electrode. Due to the forbidden band gap of each of the first and second cladding layers 4 and 6 is selected large so that a heterojunction is formed between the active layer 5 and the first and second cladding layers 4 and 6, respectively, moreover the existence of the concave portion 2 or convex portion 3 formed on the substrate 1, a stripe light emission region 8 is formed in the active layer 5 in one direction between the bent portions of the first and second cladding layers 4 and 6. Namely, the optical confinement is effected by the refractive index difference due to the above bent portions.

On the other hand, the gain-guiding type semiconductor laser device is formed as shown in FIG. 3. That is, on a substrate 1 which has a flat surface, are epitaxially grown in turn the first cladding layer 4, the active layer 5, the second cladding layer 6 and the capping layer 7 which are the same as described before. High resistance layers 9 are formed by selectively injecting, for example, protons from the above of the capping layer 7. Then, a stripe current path 10 is formed by the high resistance layers 9 and thereby the current concentration is carried out. This current concentration allows the stripe light emission region to be confined in the active layer 5.

Although the above refractive index-guiding and gain-guiding type semiconductor laser devices have respectively advantages, they have defects, respectively. More particularly, since the longitudinal mode of the refractive index-guiding type semiconductor laser device is a single mode, when this type semiconductor laser device is used as the writing or readout light source of the writing in and/or reading out apparatus for the optical video disc and so on, the laser device is easily influenced by the noise caused by the return light. On the other hand, since a so-called beam waist position exists close to the light end face of the light emission region, this refractive index-guiding type semiconductor laser device has an advantage that in the practical use the focal position can be determined with ease. Furthermore, this type laser device has such advantage that a long distance image, namely, a so-called far field pattern regarding the cross-section parallel to the junction plane is symmetrical with respect to left and right sides and that a beam spot having less distortion can be obtained with ease as the readout or writing light source in the practical use. Meanwhile, in the above gain-guiding type semiconductor laser device, there are some defects that the beam waist position exists at the position inside of the end face of the light emission region by approximately 20 $\mu$m, and furthermore the far field pattern is apt to become asymetrical with respect to left and right sides. Due to the above defects astigmatism is large and the distortion of the beam spot becomes relatively large. However, in this gain-guiding type semiconductor laser device, its longitudinal mode is multi-mode so that this laser device is less influenced by the noises caused by the returned light.

OBJECTS AND SUMMARY OF THE INVENTION

Accordingly, it is an object of the present invention to provide a semiconductor laser device which can remove the above defects inherent in the refractive index-guiding and gain-guiding semiconductor laser devices and which can have a particularly convenient combination of characteristics of both the above semiconductor laser devices.

It is another object of the present invention to provide a semiconductor laser device which is suitable for the writing and/or readout light source of writing in and/or reading out apparatus for an optical video disc, a digital audio disc and so on.

It is a further object of the present invention to provide a semiconductor laser device which can obtain a beam spot of superior shape in the use of the above light source.

It is a yet further object of the present invention to provide a semiconductor laser device which can facilitate the designing of an optical lens system and so on in the use of the above light source.

According to one aspect of the present invention, there is provided a semiconductor laser device which comprises a stripe light emission region formed in an active layer, a bent portion formed in the active layer on the light end portion of the light emission region in a range of approximately the width of the light emission region and the flat portion formed in the active layer the width of which is made larger than that of the light emission region inside of the end portion of the light emission region. In this case, the semiconductor laser device according to the present invention is formed as the refractive index-guiding type in the light output ends on both end portions of the light emission region and the gain-guiding type in at least a part of the portions inside of the light output ends.

The other objects, features and advantages of the present invention will become apparent from the following description taken in conjunction with the accompanying drawings through which the like references designate the same elements and parts.

DESCRIPTION OF THE PREFERRED EMBODIMENT

Figure 4:
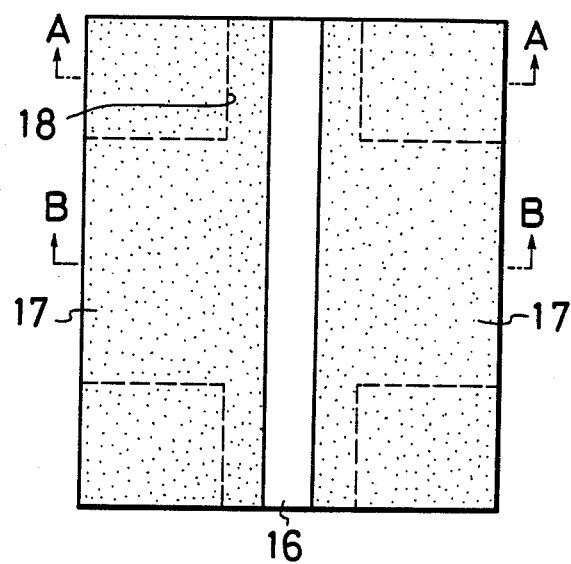
FIG. 4 is an enlarged plan view of an embodiment of the semiconductor laser device according to the present invention.
Figure 5:
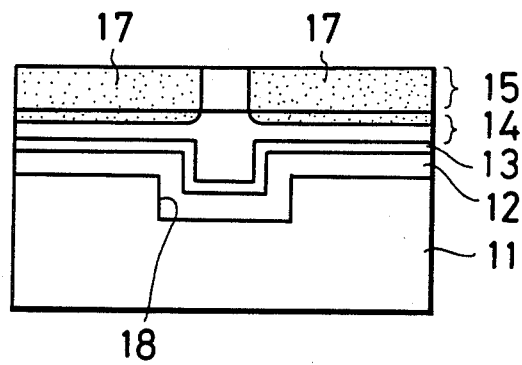
FIGS. 5 and 6 are respectively enlarged cross-sectional views taken along lines A—A and B—B in FIG. 4.
Figure 6:
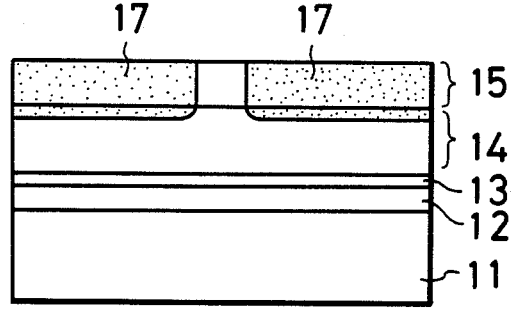

An embodiment of the semiconductor laser device according to the present invention will be described with reference to FIGS. 4 to 6. FIG. 4 is an enlarge plan view thereof, while FIGS. 5 and 6 are respectively enlarged cross-sectional views taken along lines A—A and B—B in FIG. 4.

Figure 3:
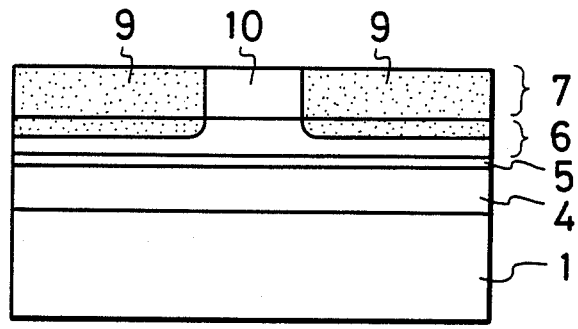

In accordance with the present invention, there is provided a single crystalline substrate, for example, an N type GaAs substrate 11. On this substrate 11 are epitaxially grown in turn a first cladding layer 12 made of $Al_xGa_{l-x}As$ of the same conductive type as that of the substrate 11, for example, N type. An N type or P type active layer 13 made of, for example, GaAs is also formed and, a second conductive type or P type cladding layer 14 made of $Al_xGa_{l-x}As$ is formed. A type capping layer 15 made of GaAs or the like which has high P type concentration is formed on layer 14. These semiconductor layers 12 to 15 can be formed by a series of works according to the MBE (molecular-beam epitaxy) method or the thermal decomposition of metal organic materials, namely, the vapor-phase epitaxial growth method employing the thermal decomposition of, for example, trimethyl alminium, trimethyl gallium and arsine and so on. And, protons are selectively injected into other portion than a stripe current path portion 16 from the surface of, for example, the semiconductor layer 15 to form a current limit region 17 having a high resistance. The depth of this current limit region 17, or the depth of proton injecting is selected to be such depth to reach the second cladding layer 14 but not the active layer 13. As described above, the stripe light emission region extending to one direction which is so-called gain-guiding type structure described in connection with FIG. 3 is formed in the active layer 13. Particularly in the present invention, at both end portions of the stripe, namely, both of the light output end portions of the light emission region, concave portions 18 are previously formed on the substrate 11, respectively and on these concave portions 18 are sequentially formed the first cladding layer 12, the active layer 13 and the second cladding layer 14. Thus, on both of the light output end portions of the light emission region, the existence of the concave portions 18 allows the bent portions to be formed gripping the light emission region of the active layer 13 and thus forming the refractive index-guiding type construction therein.

Figure 1:
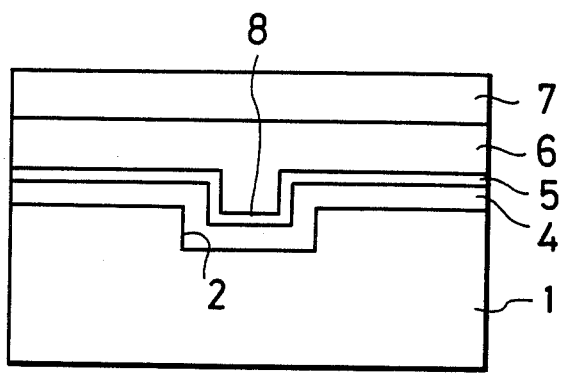
FIGS. 1 to 3 are respectively enlarged cross-sectional views of examples of conventional semiconductor laser devices.
Figure 2:
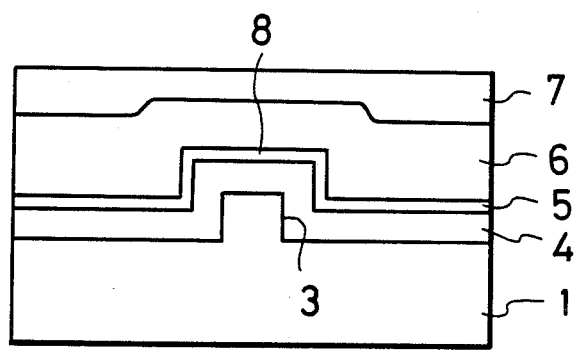

In the above embodiment of the present invention, the concave or groove portion 18 is formed on the substrate 11 to thereby form the refractive index-guiding type portion. In some case, however, such a version is possible. That is, instead of the concave portion 18, as was described with reference to FIG. 2, the convex portions are formed on the substrate 11, the convex portions are limitedly formed on both end portions, namely, the light output ends of the light emission region in its stripe direction, and then the first cladding layer 12, the active layer 13, the second cladding layer 14 and so on are formed on the convex portions so that the bent portions are formed at both sides of the light emission region in the active layer 13, thus the refractive index-guiding type construction being formed.

As mentioned above, in the above embodiment of the present invention, the concave or convex portions are formed on the substrate 11. The both sides of the light emission region at both ends thereof are gripped by the bent portion of the concave or convex portion, thus the refractive index-guiding construction being formed. In this case, when the width of the convex or concave portions is selected appropriately and the thickness of the second cladding layer 14 is also selected properly, the convex or concave portions of the substrate 11 are buried and the surface of the cladding layer 14 becomes a substantially flat surface and thereby the substantially flat capping layer 15 being formed. In order to form the bent portions positively on the active layer 13 along the concave portions 18 or convex portions on the substrate 11, it is desired that the respective semiconductor layers 12 to 14 are formed according to the above MBE method or thermal decomposition epitaxial growth method. Though not shown, one electrode is deposited on the capping layer 15 in ohmic contact therewith over the current pass portion 16 and the insulated current limit regions 17, while the other electrode is deposited on the lower surface of the substrate 11 in ohmic contact therewith.

According to the construction thus made, since the current is concentrated on the stripe region gripped by the regions 17 which are made high in resistance by the injection of, for example, protons, the stripe light emission region is formed in the active layer 13. In this case, the bent portions are formed on both sides of the respective ends of the light output end of the stripe light emission region so that the refractive index-guiding construction is provided thereat, while in the portions inside thereof there is formed the flat active layer having no bent portion which is wider in width than the stripe light emission region to thereby form therein the gain-guiding construction in which the current and optical confinements are carried out by the carrier concentration distribution due to so-called current concentration.

In the above example, the refractive index-guiding operating portions are formed on only both end portions of the light emission region. It may be possible that the gain-guiding operating portion is formed on a part of the portion inside the both ends of the light emission region and further the refractive index-guiding operating portion is formed on the other part thereof. In other words, the concave or convex portions can be formed on the above substrate 11 not only at the both ends of the stripe structure but also at the part inside thereof discontinuously. Furthermore, it may be possible that the refractive index-guiding operating portion is formed only near the end at which the beam waist position is required to be presented and the gain-guiding operating portion can be formed near the other end face at which the beam waist position is not required.

As set forth above, according to the semiconductor laser device of the present invention, since the refractive index-guiding operating portion is formed on at least one end of the light emission region and the gain-guiding operating portion is formed on at least one portion inside thereof, the advantageous characteristics of the semiconductor laser devices of both types can be established. In other words, in accordance with the present invention, since the beam waist position can be located on the end of the light emission region and the symmetry of the far field pattern is superior, such a semiconductor laser device can be provided which can easily determine the focal point with less spot distortion and whose optical system can be designed with ease.

Furthermore, since the semiconductor laser device of the present invention is less influenced by the noises caused by the returned light, when the semiconductor laser device is used for the recording and/or readout light source for the optical video disc and so on, the recording and readout can be performed with accuracy.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claim only.

We claims as our invention:

1. A semiconductor laser device having a resonant cavity and having a semiconductor substrate with a first electrode on its one major surface in which a first cladding layer, an active layer, a second cladding layer, a capping layer and a second electrode are formed on another major surface of said semiconductor substrate and a heterojunction is formed between said active layer and said first and second cladding layers respectively, comprising:

(a) a stripe emission region formed in said active layer;

(b) a concave or convex portion of said laser formed in said active layer at least on one light end of said light emission region for a range of approximately the width of said light emission region; and (c) a flat portion formed on said active layer and having a portion inside of the end portion of said light emission region and having a width which is wider than that of said light emission region.

* * * * *